United States Patent [19]
Eatock

[11] 3,988,595
[45] Oct. 26, 1976

[54] HIGH-GAIN DIFFERENTIAL INPUT COMPARATOR WITH EMITTER FEEDBACK INPUT HYSTERESIS

[75] Inventor: Fred L. Eatock, San Jose, Calif.

[73] Assignee: Fairchild Camera and Instrument Corporation, Mountain View, Calif.

[22] Filed: Jan. 19, 1976

[21] Appl. No.: 650,202

[52] U.S. Cl. .......................... 307/235 F; 307/235 T; 307/290
[51] Int. Cl.² ..................... H03K 5/20; H03K 3/295
[58] Field of Search ............ 307/290, 235 F, 235 H, 307/235 K, 235 T; 330/30 D

[56] References Cited
UNITED STATES PATENTS
3,857,047  12/1974  Knight............................ 307/235 T Primary Examiner—John Zazworsky
Attorney, Agent, or Firm—Alan H. MacPherson; Henry K. Woodward; J. Ronald Richbourg

[57] ABSTRACT

A high-voltage gain, high-current gain comparator circuit including a pair of input transistors, a constant current source, an unbalanced pair of multiple emitter active load transistors and a signal amplifier with emitter feedback to one of the active load transistors for achieving input signal hysteresis characteristics. The circuit has differential inputs, a single-ended output, inherent noise immunity and is particularly well suited for fabrication as an integrated circuit in a chip of semiconductor material.

14 Claims, 4 Drawing Figures

HIGH-GAIN DIFFERENTIAL INPUT COMPARATOR WITH EMITTER FEEDBACK INPUT HYSTERESIS

BACKGROUND OF THE INVENTION

I. Field of the Invention

This invention relates generally to circuits capable of producing an output signal which adopts one of two discrete levels in response to differences in magnitude between a pair of analog input signals and more specifically to such circuits which possess input signal hysteresis characteristics.

II. Description of the Prior Art

Comparator circuits are used to detect whether a first input signal is above or below a second input signal by a preselected amount and indicate this relationship by means of an output signal or signals. Those comparator circuits possessing a single output terminal on which one of two selected output signals appear, depending on the relationship between the two input signals, are said to have a single-ended output. Such an arrangement contrasts with comparator circuits having differential outputs. In these circuits, one input signal relationship is indicated by a high-level signal on a first output terminal and a low-level signal on a second output terminal. The other input signal relationship is indicated by the high- and low-level output signals appearing on opposite output terminals. Comparator circuits with single-ended outputs are frequently easier for logic systems designers to use and therefore are more desirable than comparators with differential outputs.

Noise in the input signals to a comparator circuit can produce incorrect output indications if the input differential is near the threshold level which divides one ouput indication from the other. The problems that input signal noise create are reduced by inroducing hysteresis into the relationship between input signal differentials and ouput signals. This is accomplished by separating the threshold points at which the output indication changes such that increased absolute values of input signal differentials are required to achieve a change in the output signal.

The gain of a comparator circuit, as referred to herein, is the relationship of the input voltage change required for a given ouput voltage change. Although comparator circuits are known which have both high-current and high-voltage gain, previously described integrated comparators have achieved the hysteresis function at the expense of additional circuitry and a reduction in voltage gain. In addition, known comparator circuits employing multiple cascaded circuit stages are frequently unsatisfactory for many applications requiring high accuracy; (i.e., sharp edges on the output waveforms) where the analog input signals vary slowly in magnitude with respect to each other over time. Moreover, because most present day comparator circuits are embodied as integrated circuits in chips of semiconductor material, complex comparator circuits having many individual circuit elements are generally less attractive than simpler circuits. This is because complex circuits generally require more chip area than simpler circuits (a factor which inversely affects the process yield), and therefore cost more to fabricate.

Two examples of typical prior art comparator circuits are diclosed in U.S. Pat. No. 3,628,059 entitled "HIGH-VOLTAGE FUNCTIONAL COMPARATOR" issued to George G. Y. Niu on Dec. 14, 1971 and U.S. Pat. No. 3,848,139 entitled "HIGH-GAIN COMPARATOR CIRCUIT" issued to James G. Holt, Jr., on Nov. 12, 1974. Both of these patents are assigned to the assignee of this application.

SMMARY OF THE INVENTION

The present invention overcomes many of the disadvantages associated with comparators known in the prior at. It does so by providing a novel high-gain comparator circuit structure with input hysteresis characteristics for selectively producing one of two selected ouput signals on a comparator output signal terminal in response to selected differences in magnitude of first and second input signals. The circuit includes a first current source means connected to a first power supply reference potential for producing a first substantially constant current $21$, first and second switching means connected to the first current source means for passing variable currents $I_{C1}$ and $I_{C2}$, respectively, wherein $2I = I_{C2}$, each of the first and second switching means possessing an output terminal and each possessing a control input terminal for receiving a respective one of the first and second input signals; third and fourth switching means coupled together for selectively passing portions of the variable currents $I_{C1}$ and $I_{C2}$, each of the third and fourth switching means possessing both an input terminal connected to the ouput terminal of the first and second switching means respectively and at least one output terminal; resistive network means connected between the output terminals of the third and fourth switching means and a second power supply reference potential for controlling the input hysteresis characteristics of the comparison circuit; signal amplifier means possessing an input terminal connected to the output terminal of the second switching means and an output connected to the comparator output signal terminal for producing the two selected output signals; and feedback means connected between the comparator output signal terminal and a selected one of the output terminals of the third and fourth switching means for controlling the relative current flow through the third and fourth switching means.

Further, in addition to having desirable high-voltage gain and high-current gain achieved in a relatively simple circuit, the comparator circuit of the invention combines input hysteresis characteristics with a pair of floating differential inputs and a differential to single-ended output conversion; the combination requiring less chip area than heretofore possible when embodied in a monolithic design. This reduction in chip area leads to higher manufacturing yields and associated lower costs.

BRIEF DESCRIPTION OF THE DRAWINGS

The many objects and advantages of the present invention will become apparent to those skilled in the art when the following description of the best mode contemplated for practicing the invention is read in conjunction with the accompanying drawings, wherein like reference characters refer to the same or similar elements, and in which.

Figure 1:
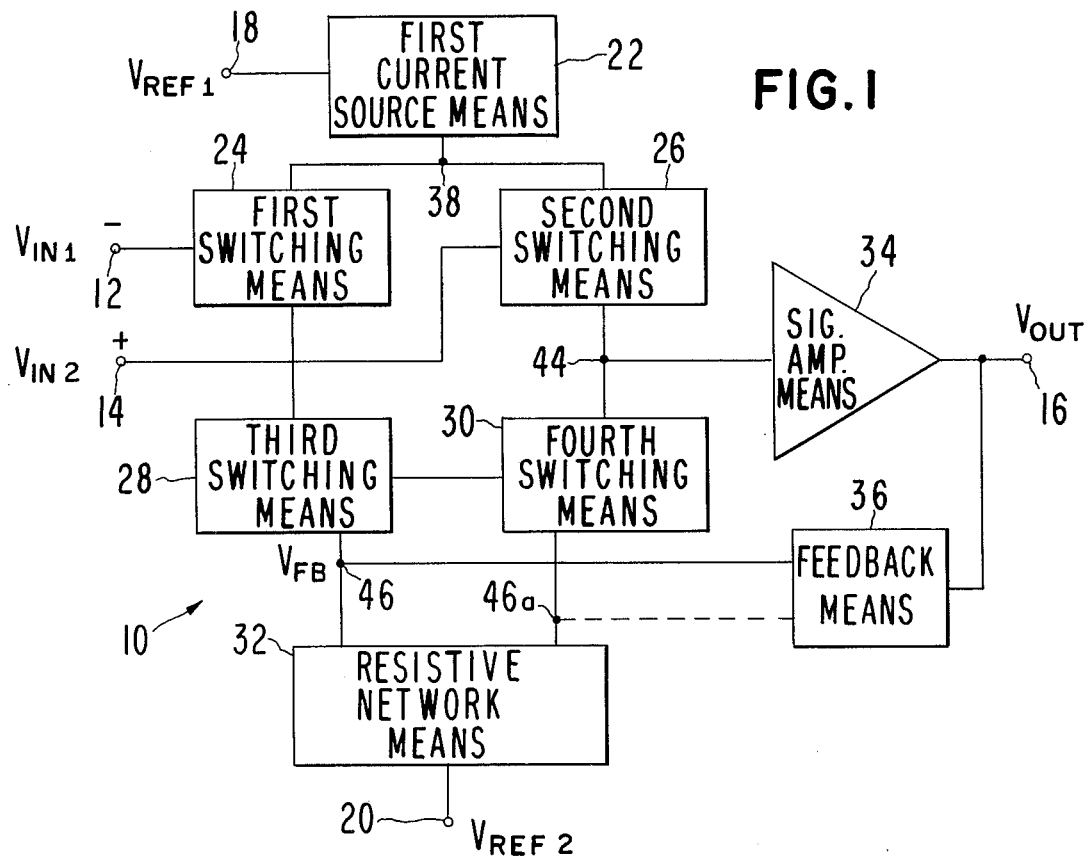
FIG. 1 is a block schematic diagram showing the interrelationship between individual functional elements of the invention.
Figure 2:
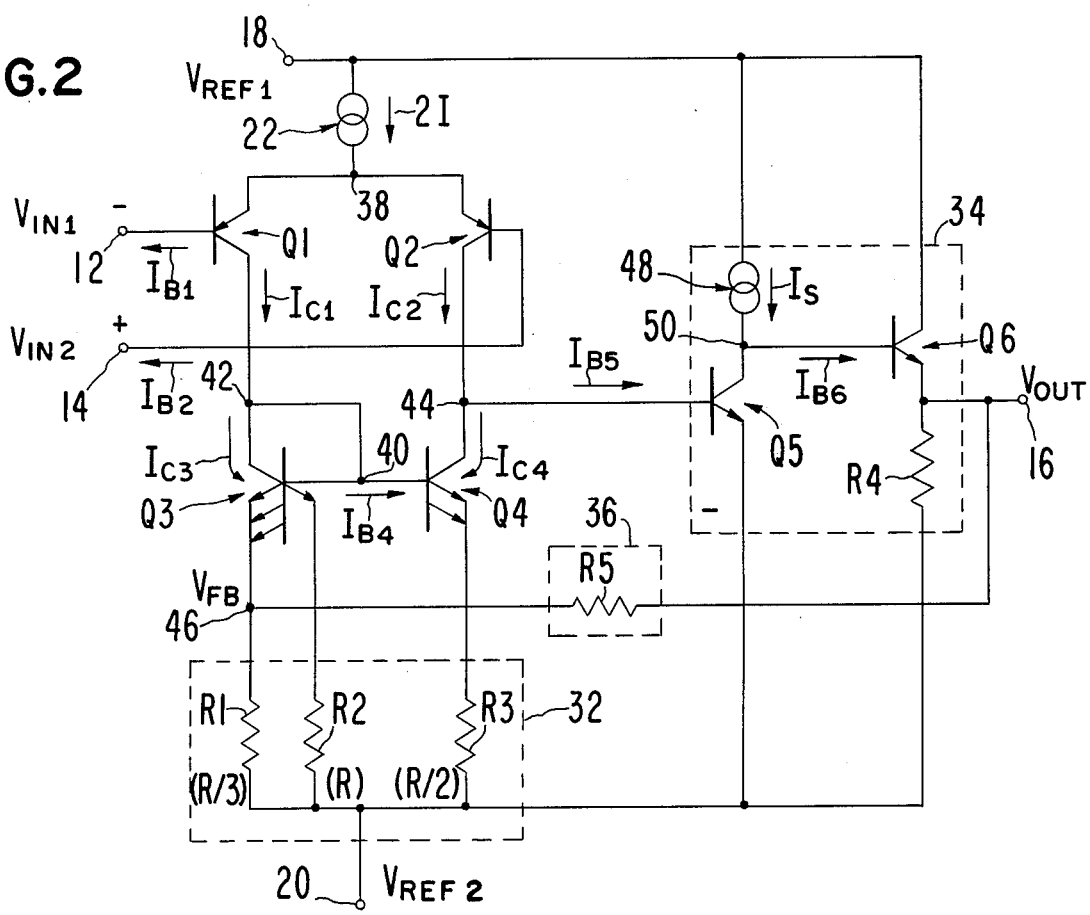
FIG. 2 is a schematic diagram of the presently preferred embodiment of the invention.

The presently preferred embodiment of the invention is shown schematically in FIG. 2. The first power supply reference potential $V_{REF1}$ is applied at the node 18 causing the first constant current 2I to flow from the first current source means 22 into the node 38 which is connected to the emitter terminals of a matched pair of PNP transistors Q1 and Q2 respectively. Although PNP transistors are used for Q1 and Q2 in this embodiment, a complimentary arrangement of NPN transistors can also be used if appropriate modifications well known in the art are made. The base terminals of the transistors Q1 and Q2 are connected to the control input terminals 12 and 14 respectively. The collector terminals of the transistors Q1 and Q2 are connected respectively to the collector terminals of a pair of multiple emitter NPN transistors Q3 and Q4. The base terminals of the transistors Q3 and Q4 are connected together at a node 40 which is connected to the collector terminal of Q3 at a node 42. The input to the signal amplifier means 34 is the base terminal of an NPN transistor Q5 which is connected to the collector terminal of the transistor Q4 at a node 44. The collector terminal of the transistor Q5 is connected to the first power supply reference potential $V_{REF1}$ through a second current sorce means 48 which provides a second constant current $I_S$. The emitter terminal of the transistor Q5 is connected to the second power supply reference potential $V_{REF2}$. The base terminal of an NPN transistor Q6 is connected to the collector terminal of the transistor Q5 at a node 50. The collector terminal of the transistor Q6 is connected to the first power supply reference potential $V_{REF1}$. The emitter terminal of the transistor Q6 is connected to the comparator output signal terminal 16. A load resistor R4 is connected between the comparator output signal terminal 16 and the second power supply reference potential $V_{REF2}$. In this embodiment, the transistor Q3 is provided with four equal area emitters, three of which are connected together to form a triple emitter which is connected to the second power supply reference potential $V_{REF2}$ through a load resistor R1. The remaining single emitter of Q3 is similarly connected to $V_{REF2}$ through a load resistor R2. The transistor Q4 is provided with two equal area emitters each of the same size as each of the four equal area emitters on the transistor Q3. Both of these emitters are connected together to form a double emitter which is connected to the second power supply reference potential $V_{REF2}$ through a load resistor R3. In this embodiment the load resistors R1, R2 and R3 comprise the resistive network means 32. To obtain the desired symmetrical input hysteresis characteristics, they are ratioed as follows: R2 has a selected value R; R1 is R/3 and R3 is R/2. These ratios provide uniform current loading of each of the six equal area emitters on the transistors Q3 and Q4. The feedback means 36 comprises a resistor R5 connected between the comparator output signal terminal 17 and the triple emitter of the transistor Q3 at a node 46. The signal amplifier means 34 in this embodiment has an inverted output, i.e., when the input is high the output is low and visa versa.

Figure 3:
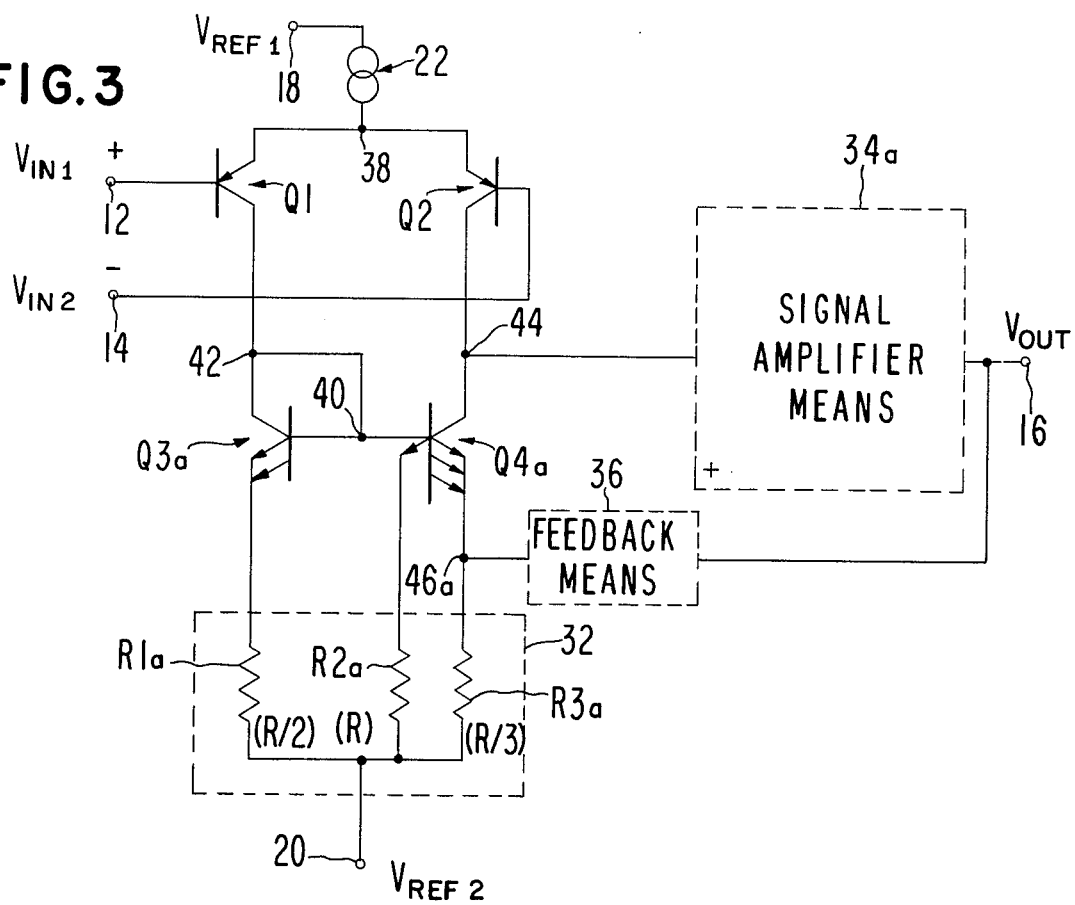
FIG. 3 is a partial schematic diagram of another embodiment of the comparator circuit of the invention.

Another embodiment of the present invention is shown schematically in FIG. 3. Therein, an NPN transistor Q4a is provided with four equal area emitters and another NPN transistor Q3a is provided with two equal area emitters. The two equal area emitters on the transistor Q3a are connected together to form a double emitter which is connected to the second power supply reference potential $V_{REF2}$ through a load resistor R1a. Three of the four equal area emitters on the transistor Q4a are connected together to form a triple emitter which in turn is connected to $V_{REF2}$ through a load resistor R3a. The remaining single emitter on the transistor Q4a is similarly connected to $V_{REF2}$ through a load resistor R2a. The valuues of the three load resistors R1a, R2a and R3a are again ratioed such that each of the six individual equal area emitters on the transistors Q3a and Q4a are equally biased. The feedback means 36 is connected between the comparator circuit output signal terminal 16 and the triple emitter on the transistor Q4a at a node 46a. In this embodiment a non-inverted signal amplifier means 34a is coupled to the triple emitter of Q4a at a node 46a by way of the feedback means 36 to produce the desired input hysteresis characteristics.

In each embodiment the multiple emitter structures of each transistor, Q3, Q4, Q3a and Q4a may be replaced by a single appropriately area-scaled emitter without materially altering the performance characteristics of the embodiments. In fact, such a replacement is preferred when semiconductor chip size and cost factors are considered.

Figure 4:
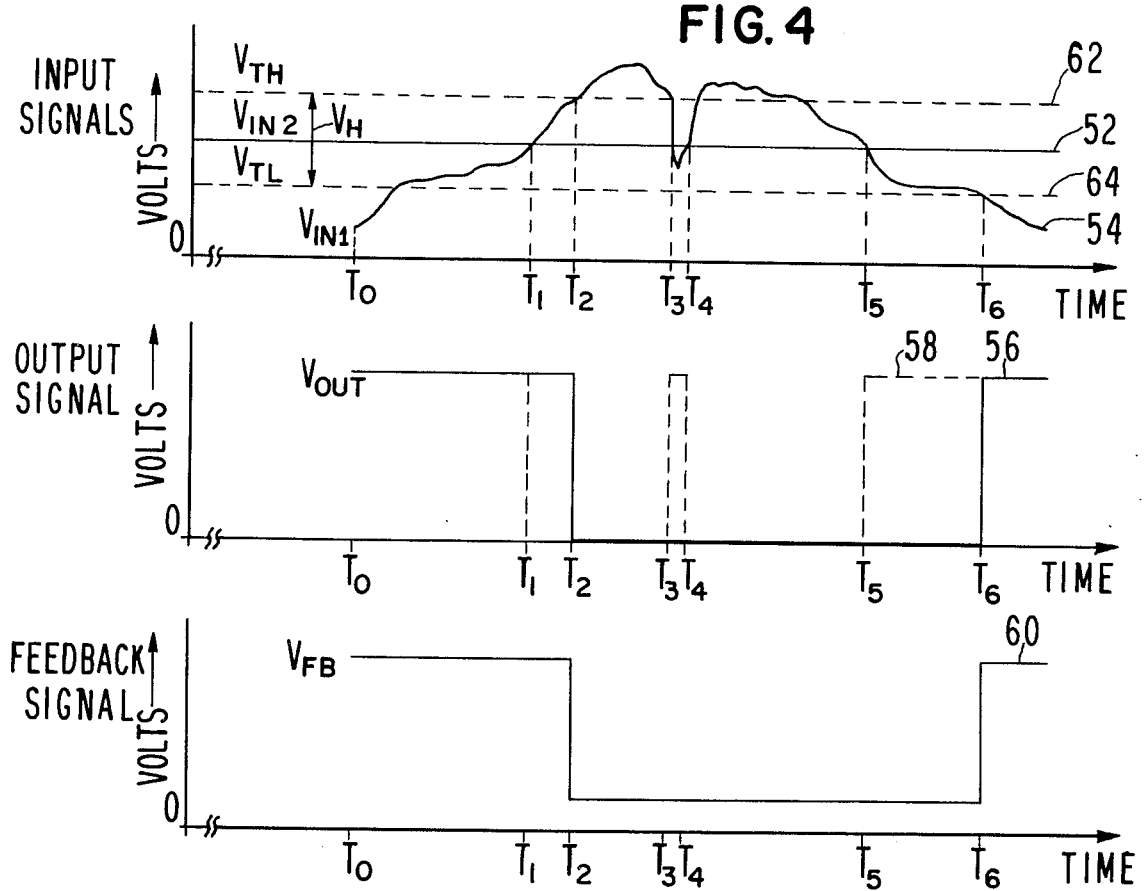
FIG. 4 is a stylized timing diagram of selected voltages associated with the operation of the comparator circuit of FIG. 2 wherein the power supply reference potential $V_{REF2}$, a user selected voltage, is assumed to be zero volts. cl DETAILED DESCRIPTION OF THE PREFERRED EMBODIMENT Referring now generally to the several figures and specifically to FIG. 1, the high-gain comparator circuit of the invention can be shown comprising a pair of control input terminals 12 and 14, a comparator outut terminal 16, a pair of power supply reference potential nodes 18 and 20, a first current source means 22, first, second, third and fourth switching means 24, 26, 28 and 30 respectively, a resistance network means 32, a signal amplifier means 34, and a feedback means 36 which are functionally interconnected as shown. As will be described in greater detail below, a pair of signal voltages $V_{IN1}$ and $V_{IN2}$ are applied at the pair of control input terminals 12 and 14 respectively. The comparator circuit 10 of FIG. 1 produces an ouput voltage, $V_{OUT}$ at the comparaor outut signal terminal 16 which is high or low depending on whether the difference between $V_{IN1}$ is larger or smaller than $V_{IN2}$ by a preselected amount. A first power supply reference potential $V_{REF1}$ is applied at the node 18 causing a first constant current having a magnitude 2I to flow from the first current source means 22 to a node 38 which is connected to the first and second switching means 24 and 26 respectively. The first constant current flows in varying proportions through the first and second switching means as a function of the relative magnitudes of $V_{In1}$ and $V_{IN2}$. In the preferred embodiment, when the output signal $V_{OUT}$ at the comparator output signal terminal 16 is high, no part of the first constant current flows into the signal amplifier means 34 which is conncted at a node 44. Rather, the entire first constant current flows in varying proportions through the third and fourth switching means 28 and 30 respectivelly into the resistive network means 32 which is in turn connected to a second power supply reference potential $V_{REF2}$ at the node 20. Again, in the preferred embodiment, the third switching means 28 is so structured that it has two current conduction levels, one greater than and the other less than the current conduction level of the fourth switching means 30. When $V_{OUT}$ is high, the feedback means 36 connected to a node 46 associated with a selected output terminal on the third switching means provides a feedback voltage $V_{FB}$ which causes the third switching means 28 to have a lower current conduction capability than the fourth switching means 30. At a selected differential between $V_{IN1}$ and $V_{IN2}$, that portion of the first constant current 2I flowing through the second switching means 26 can no longer flow exclusively through the fourth switching means 30 but begins to flow into the signal amplifier means 34. When this happens, the output signal $V_{OUT}$ goes low reducing the feedback voltage $V_{FB}$ applied at the node 46 resulting in the current conduction capability of the third switching means 28 becoming relatively greater than the current conduction capability of the fourth switching means 30. This action assures that an increased portion of the first constant current 2I will continue to flow into the signal amplifier means 34 until the input signal voltages $V_{IN1}$ and $V_{IN2}$ are such that a larger proportion of the first constant current flows through the third switching means 28. At this point, all of the current flowing through the second switching means 26 flows into the fourth switching means 30 causing the output signal $V_{OUT}$ to return to a high level.

The operation of the comparator circuit of the invention can best be understood by reference to FIG. 4, which is a stylized timing diagram of selected voltages associated with the presently preferred embodiment shown in FIG. 2 wherein $V_{REF2}$ is assumed to be at ground potential (zero volts). In this description of circuit operation, the input signal $V_{IN2}$ (which can be time dependent) remains constant with time as a reference voltage and is represented in FIG. 4 by the straight line waveform 52. The input signal $V_{IN1}$ represented by the waveform 54 and applied at the control input terminal 12 varies with respect to $V_{IN2}$ over time. A small minus sign (−) appears near the control input terminal 12 in FIG. 2 indicating that the output signal $V_{OUT}$ is inverted with respect to the voltage differential $V_{IN1}$ minus $V_{IN2}$. For example, when the variable input signal $V_{IN1}$ is greater than the reference input signal $V_{IN2}$ by a selected amount, then the output signal $V_{OUT}$ is low. Conversely, if $V_{IN1}$ had been designated as the reference signal and $V_{IN2}$ were allowed to vary over time, then when the variable input signal $V_{IN2}$ exceeded the reference signal $V_{IN1}$ by another selected amount, the output signal $V_{OUT}$ would be high (non-inverting). The output signal $V_{OUT}$ is represented by the waveform 56. Another waveform 58, shown with broken lines, is included to show what the output of the comparator would be if no input hysteresis were provided to inhibit the potentially undesireable high output signal voltage between times $T_3$ and $T_4$. The feedback voltage $V_{FB}$ at the node 46 is represented by a waveform 60. The high and low threshold voltages for the comparator circuit $V_{TH}$ and $V_{TL}$ are represented by two dashed lines 62 and 64 respectively.

At a time $T_0$ shown in FIG. 4, $V_{IN1}$ is less than $V_{IN2}$. Since the transistors Q1 and Q2 are matched PNP type transistors, the more negative signal $V_{IN1}$ applied to the base of transistor Q1 forward biases this transistor's base-emitter junction further into conduction than the base-emitter junction of transistor Q2, which is biased with the more positive input signal $V_{IN2}$ applied to its base terminal. Therefore the current $I_{C1}$ is greater than the current $I_{C2}$ because the transistor Q1 is more conductive than the transistor Q2 at this time. Although there are small currents $I_{B1}$ and $I_{B2}$ associated with the input signals $V_{IN1}$ and $V_{IN2}$ respectively, these currents are small and will hereafter be ignored. Therefore, $I_{C1} + I_{C2} = 2I$, the constant current flowing from the first current source means 22. At time $T_0$ both $V_{OUT}$ and $V_{FB}$ are high. This means that the transistor Q6 is ON allowing current to flow from the first power supply reference potential $V_{REF1}$ applied at the node 18 through the transistor Q6 and through the biasing resistor R4 to the second power supply reference potential $V_{REF2}$. The transistor Q6 is turned ON by a current $I_{B6}$ applied to its base terminal. $I_{B6}$ is present when the second constant current $I_S$ produced by the second current source means 48 is not allowed to flor through the transistor Q5 to the node 20. The transistor Q5 is OFF when $I_{B5}$ equals zero and $I_{C2}$ equals $I_{C4}$. Because $V_{FB}$ is high, the flow of current through the triple emitter of Q3 is restricted causing almost all of $I_{C1}$ to flow through the single emitter of Q3 or into the base or the transistor Q4 insuring that it is fully ON.

As a function of time, $V_{IN1}$ increases with respct to $V_{IN2}$ thereby decreasing $I_{C1}$ relaive to $I_{C2}$ until at a time $T_1$, $_{IN1}$ equals $V_{IN2}$. As indicated by the waveform 58, $V_{OUT}$ would go low at time $T_1$ in a comparator circuit without hysteresis. However, in the circuit of FIG. 2, $V_{OUT}$ and $V_{FB}$ remain high and thus the three emitters of transistor Q3 connected to node 46 do not conduct. These conditions continue until $V_{IN1}$ has increased relative to $V_{IN2}$ such that at time $T_2$, $I_{C1}$ equals one-half $I_{C2}$, i.e., $I_{C1} = 2/3\ I$ and $I_{C2} = 4/3\ I$. At this point, equal currents of $2/3\ I$ are flowing through each of the three conducting equal area emitters, i.e. those emitters not connected to node 46, of the transistors Q3 and Q4. Any further increase in $V_{IN1}$ relative to $V_{IN2}$ increases the current $I_{C2}$ relative to the current $I_{C4}$ and drives the difference current $I_{B5}$ into the base of the transistor Q5 thereby turning it ON. When the transistor Q5 is ON, the second constant current $I_S$ from the second current source means 48 no longer flows into the basse of the transistor Q6 but flows directly through Q5 to the node 20 at which the second power supply reference poential $V_{REF2}$ is applied. The absence of the current $I_{B6}$ turns the transistor Q6 OFF and brings the output signal $V_{OUT}$, together with the derived feedback signal $V_{FB}$, low. As $V_{FB}$ goes low, the triple emitter on the transistor Q3 becomes conductive which further decreases the current $I_{C4}$ relative to the current $I_{C2}$ thereby increasing the current $I_{B5}$ into the signal amplifier means 34 and reinforcing the low output signal at the comparator output signal terminal 16. Transistor Q5 is now either saturated or close to saturation.

Where the six equal area emitters on the transistors Q3 and Q4 are ratioed and biased as described above, it is possible to calculate the differential voltage required between $V_{IN1}$ and $V_{IN2}$ at the high threshold point starting from the well-known diode equation:

$$I_D = I_{SAT}\,[e^{q\,V_D/kT} - 1], \tag{1}$$

where $I_D$ is current flowing through the diode, $I_{SAT}$ is the saturation current of the diode, $V_D$ is the voltage across the diode, $q$ is the charge on an elctron, $k$ is the well-known Boltzmann's constant, and $T$ is the temperature in degrees Kelvin. Using the diode equation, the currents $I_{C1}$ and $I_{C2}$ for transistors Q1 and Q2 can be expressed as follows:

$$I_{C1} = I_{SATQ1} [e^{q V_{BE1}/kT} - 1]; \tag{2}$$

and $$I_{C2} = I_{SATQ2} [e^{q V_{BE2}/kT} - 1], \tag{3}$$

where $I_{SATQ1}$ and $I_{SATQ2}$ are the saturated currents of the transistors Q1 and Q2 respectively and are equal because Q1 and Q2 are matched transistors and $V_{BE1}$ and $V_{BE2}$ are the base-emitter junction voltages of Q1 and Q2, respectively. Under normal operating conditions:

$$e^{q V_{BE1}/kT} \text{ and } e^{q V_{BE2}/kT}$$

are both much larger than 1, and the equations (2) and (3) can be simplifid as follows:

$$I_{C1} = I_{SATQ1} e^{q V_{BE1}/kt}; \tag{4}$$

and $$I_{C2} = I_{SATQ2} e^{q V_{BE2}/kt}. \tag{5}$$

The equations (4) and (5) can be solved for $V_{BE1}$ and $V_{BE2}$ yielding respectively:

$$V_{BE1} = kT/q \ln I_{C1}/I_{SATQ1}; \text{ and} \tag{6}$$

$$V_{BE2} = kT/q \ln I_{C2}/I_{SATQ2}. \tag{7}$$

Knowing from the description above that at the high threshold point $I_{C1} = \frac{2}{3}I$ and $I_{C2} = 4/3\ I$, the upper input threshold voltage $V_{TH}$ can be expressed as:

$$V_{TH} = V_{IN2} + V_{BE2} - V_{BE1} \tag{8}$$

Substituting for $V_{BE1}$ and $V_{BE2}$ and reducing, $$V_{TH} = V_{IN2} + kT/q \ln I_{C2}/I_{SATQ2} - kT/q \ln I_{C1}/I_{SATQ1} \tag{9}$$
$$= V_{IN2} + kT/q \ln I_{C2}/I_{C1} \cdot I_{SATQ1}/I_{SATQ2} \tag{10}$$

Since Q1 and Q2 are matched transistors, $I_{SATQ1} = I_{SATQ2}$ and euation (10) reduces to:

$$V_{TH} = V_{IN2} + kT/q \ln I_{C2}/I_{C1} \tag{11}$$

Substituting for $I_{C1} = \frac{2}{3}\ I$ and $I_{C2} = 4/3\ I$ results in:

$$V_{TH} = V_{IN2} + kT/q \ln 2 \tag{12}$$

Therefore the voltage at the high threshold point is $V_{TH} = V_{IN2} + 18$ mV at 300° Kelvin.

Referring again to FIG. 4, the variable input signal $V_{IN1}$ represented by the waveform 54 has a voltage spike which crosses the reference input signal $V_{IN2}$ represented by the waveform 52 at times $T_3$ and $T_4$ before finally crossing $V_{IN2}$ at time $T_5$. Such a voltage spike can be produced by noise in the input signal $V_{IN1}$. This undesired voltage spike would generate an erroneous high output signal $V_{OUT}$ between times $T_3$ and $T_4$ as shown by the waveform 58 if the comparator circuit did not have input hysteresis characteristics.

At time $T_5$, $V_{IN1} = V_{IN2}$. Again, as indicated by the waveform 58, $V_{OUT}$ would go high in a comparator circuit without hysteresis. However, in th circuit of FIG. 2, $V_{OUT}$ and $V_{FB}$ remain low. These conditions continue until $V_{IN1}$ has decreased relative to $V_{IN2}$ such that at time $T_6$, $I_{C2} = \frac{1}{2} I_{C1}$, i.e., $I_{C1} = 4/3\ I$ and $I_{C2} = \frac{2}{3}\ I$. At this point, approximately equal currents of $\frac{1}{3}\ I$ are flowing through each of the six conducting equal area emitters of the transistors Q3 and Q4. The input current $I_{B5}$ (which is $I_{C2} - I_{C4}$) to the signal amplifier means 34 is almost zero. Any further decrease in $V_{IN1}$ relative to $V_{IN2}$ turns the transistor Q5 off causing the second constant current $I_S$ to flow into the base of the transistor Q6. This base current, $I_{B6}$, turns the transistor Q6 ON driving both the output signal $V_{OUT}$ and the derived feedback signal $V_{FB}$, high. As $V_{FB}$ goes high, the triple emitter on the transistor Q3 becomes non-conductive which increases the current $I_{C4}$ thereby further reducing $I_{B5}$ and reinforcing the high output signal at the comparator output signal terminal 16.

A calculation analogous to the one performed above can be made to determine the differential voltage required between $V_{IN1}$ and $V_{IN2}$ at the low threshold point $V_{TL}$. At time $T_6$ shown in FIG. 4, $I_{C1} = 4/3\ I$ and $I_{C2} = \frac{2}{3}\ I$. Substituting these values in equation (11) above gives $V_{TL}$ as follows:

$$V_{TL} = V_{IN2} + kT/q \ln \left[\frac{2/3\ I}{4/3\ I}\right] \tag{13}$$

or $$V_{TL} = V_{IN2} - kT/q \ln 2 \tag{14}$$

Therefore, the voltage at the low threshold point $V_{TL} = V_{IN2} - 18$ mV at 300° Kelvin. The input hysteresis voltage $V_H$ is defined as the voltage difference between the high, and the low threshold points $V_{TH}$ and $V_{TL}$. In this example, $V_H = 36$ mV at 300° Kelvin. As a feature of this invention, the input hysteresis voltage $V_H$ is a parameter accurately controlled by the ratios of the emitter areas of ransistors Q3 and Q4 and the resistive network means 32. Although the presently preferred embodiment described above has symmetrical input hysteresis characerstics, unsymmetrical or scaled hysteresis characteristics can be provided.

The comparator circuit of the invention is incorporated in an integrated circuit form as part of a dual tachometer circuit bearing Fairchild Part No. UA 789.

In FIG. 2 the transistors Q3 and Q4 are shown with four and two emitter symbols respectively. Each emitter symbol denotes one emitter having an area equal to the area of each of the other emitters. Equivalent transistors can be obtained by replacing each group of connected emitters with a single emitter having an equivalent area. This is the preferred way of implementing this invention. Referring now to FIG. 2, the object of the four emitters of Q3 and the two emitters of Q4 is to influence the collector currents of Q1 and Q2 at the switching points. Thus, when $V_{FB}$ is high, the circuit appears as though the three emitters of transistor Q3 connected to node 46 are non-conducting. Only one emitter of Q3 is conducting and by the ratio of the area of the conducting emitter of Q3 to the area of the two conducting emitters of Q4 and the ratio of the resistor R2 to the resistor R3, the condition $I_{C4} = 2I_{C3} = 2I_{C1}$ must be in force. Thus, for $V_{OUT}$ to change its signal level, $I_{C2} \simeq I_{C4}$ (as $I_{B5} = 0$) and therefore $I_{C2} \simeq 2I_{C1}$. The voltage at which this occurs determines the high threshold lvel $V_{TH}$.

After the switching acton takes place and $V_{FB}$ is low, the three emitters of $Q_3$ conncted to node 46 are conducting.

At th lower switching point (i.e., the lower threshold voltage $V_{TL}$) where $I_{C2} = I_{C4}$, $I_{C3} = 2I_{C4}$ and $I_{C1} = 2I_{C4} = 2I_{C2}$ or $I_{C1} = 2I_{C2}$.

Note that when $V_{OUT}$ is high, the ratio of the area A3 of the conducting emitters of Q3 to the area A4 of the conducting emitters of Q4 is A3/A4 = ½. When $V_{OUT}$ is low, the ratio is A3/A4 = 2. By changing the ratios of A3/A4 for the two states of $V_{OUT}$, the range of hysteresis is changed. Furthermore, the ratio of the effective vaue of the emitter resistor of Q3 to the effective value of the emitter resistor of Q4 also influences the value of hysteresis voltage. The above discussion assumes that Q3 and Q4 have identical high values of $\beta$ (i.e., the ratio of collector-to-base current) and that the six emitters of Q3 and Q4 have identical $V_{BE}$ (i.e., identical base-to-emitter voltages at identical current densities).

From the foregoing detailed description, it will be evident that there are a number of changes, adaptations and modifications of the present invention which come within the province of those skilled in the at; however, it is intended that all such variations not departing from the spirit of the invention be considered as within the scope thereof as limited solely by the appended claims.

What is claimed is:

1. A high-gain comparator circuit structure with input hysteresis characteristics for selectively producing one od two selected outut signals on a comparator output signal terminal in response to selected differences in magnitude of first and second input signals, said structure comprising:
   a first current source means connected to a first power supply reference potential for producing a first substantially constaat current 2I;
   first and second switching means connected to said first current source means for passing variable currents $I_{C1}$ and $I_{C2}$, respectively, wherein $2I = I_{C1} + I_{C2}$, each of said first and second switching means possessing an output terminal, and each possessing a control input terminal for receiving a respective one of said first and second input signals;
   third and fourth switching means coupled together for selectively passing portions of said variable currents $I_{C1}$ and $I_{C2}$, each of said third and fourth switching means possessing both an input terminal connected to said output terminal of sid first and second switching means, respectively, and at least one output terminal;
   resistive network means connected between said output terminals of said third and fourth switching means and a second power supply reference potential for controlling the input hysteresis characteristics of said comparator circuit;
   signal amplifier means possessing an input terminal connected to said output terminal of said second switching means and an output connected to said comparator output signal terminal for producing said two selected ouput signals; and
   feedback means connected between said comparator output signal terminal and a selected one of said output terminals of said third and fourth switching means for controlling the relative current flow through said third and fourth switching means.

2. The structure of claim 1 wherein said first switching means comprises:
   a first transistor having an emitter connected to said first current source means, a base connected to said control input terminal for receiving said first input signal and a collector connected to said input terminal of said third switching means.

3. The structure of claim 2 wherein said second switching means comprises:
   a second transistor having an emitter connected to said first current source means, a base connected to said control input terminal for receiving said second input signal and a collector connected to both said input terminal of said fourth switching means and said input terminal of said signal amplifier means.

4. The structure of claim 3 wherein sid third switching means comprises:
   a third transistor hving both a base and a collector connected to said collector of said first transistor and a plurality of emitters selectively connected to said resistive network means.

5. The structure of claim 4 wherein said fourth switching means comprises:
   a fourth transistor having a base connected to said base of said third transistor, a collector connected to said collector of said second transistor and a plurality of emitters selectively connected to said resistive network means.

6. The structure of claim 5 wherein said third transistor has four equal area emitters, three of said four equal area emitters connected together to form one triple emitter and one single emitter, and wherein said fourth transistor has two equal area emitters connected together to form one double emitter.

7. The structure of claim 6 wherein said resistive network means comprises:
   a second resistor of selected value connected between said single emitter of said third transistor and said second power supply reference potential;
   a first resistor one-third the value of said second resistor connected between said triple emitter of said third transistor and said second power supply reference potential; and
   a third resistor one-half the value of said second resistor connected between said double emitter of said fourth transistor and said second power supply potential.

8. The structure of claim 7 wherein said signal amplifier means comprises:
   a second current source means connected to said first power supply reference potential for producing a second substantially constant current;
   a fifth transistor having a collector connected to said second current source means, a base connected to said collector of said second transistor and an emitter connected to said second power supply reference potential;
   a sixth transistor having a collector connected to said first power supply reference potential, a base connected to said collector of sid fifth transistor, and an emitter connected to said comparator output signal terminal; and
   a fourth resistor of selected value connected between said comparator output signal terminal and said second power supply reference potential.

9. The structure of claim 8 wherein said feedback means comprises;

a fifth resistor of selected value connected between said comparator output signal terminal and said triple emitter of said third transistor.

10. The structure of claim 9 embodied as an integrated circuit in a chip of semiconductor material.

11. The structure of claim 5 wherein said third transistor as two equal area emitters connected together to form one double emitter and wherein said fourth transistor has four equal area emitters, three of said four equal area emitters connected together to form one triple emitter and one single emitter.

12. The structure of claim 11 wherein said resistive network means comprises;

a second resistor of selected value connected between said single emitter of said fourth transistor and said second power supply reference potential;

a first resistor one-half the value of said second resistor connected between said double emitter of said third transistor and said second power supply reference potential; and a third resistor one-third the value of said second resistor connected between said triple emitter of said fourth transistor and said second power supply reference potential.

13. The structure of claim 12 wherein said feedback means is connected between said comparator output signal terminal and said triple emitter of said fourth transistor.

14. The structure of claim 13 embodied as an integraed circuit in a chip of semiconductor material.

* * * * *